(12) United States Patent
Sasaki et al.

(10) Patent No.: US 10,522,592 B2
(45) Date of Patent: Dec. 31, 2019

(54) TUNNEL MAGNETORESISTIVE EFFECT ELEMENT, MAGNETIC MEMORY, AND BUILT-IN MEMORY

(71) Applicant: TDK CORPORATION, Tokyo (JP)

(72) Inventors: Tomoyuki Sasaki, Tokyo (JP); Yoshitomo Tanaka, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 16/080,971

(22) PCT Filed: Oct. 16, 2017

(86) PCT No.: PCT/JP2017/037418
§ 371 (c)(1),
(2) Date: Aug. 29, 2018

(87) PCT Pub. No.: WO2019/077662
PCT Pub. Date: Apr. 25, 2019

(65) Prior Publication Data
US 2019/0333966 A1    Oct. 31, 2019

(51) Int. Cl.
*H01L 27/22* (2006.01)
*H01F 10/32* (2006.01)
(Continued)

(52) U.S. Cl.
CPC .......... *H01L 27/228* (2013.01); *G11C 11/161* (2013.01); *H01F 10/329* (2013.01); *H01F 10/3259* (2013.01); *H01F 10/3272* (2013.01); *H01F 10/3286* (2013.01); *H01F 41/34* (2013.01); *H01L 23/528* (2013.01);
(Continued)

(58) Field of Classification Search
CPC .............. G11C 11/161; H01F 10/3259; H01F 10/3272; H01F 10/3286; H01F 10/329; H01F 41/34; H01L 23/5226; H01L 23/528; H01L 27/228; H01L 43/02; H01L 43/12
See application file for complete search history.

(56) References Cited

U.S. PATENT DOCUMENTS

2002/0186011 A1* 12/2002 Murata .................. B82Y 25/00
324/252
2012/0018825 A1* 1/2012 Lim ...................... G11C 11/161
257/421
(Continued)

FOREIGN PATENT DOCUMENTS

JP    2010-232499 A    10/2010
JP    2013-016587 A    1/2013
(Continued)

*Primary Examiner* — Allan R Wilson
(74) *Attorney, Agent, or Firm* — Oliff PLC

(57) ABSTRACT

A TMR element includes a base layer that is disposed on an upper surface of a via interconnect part, a magnetic tunnel junction that is disposed on a surface of the base layer, and an interlayer insulation layer that covers a side surface of each of the via interconnect part and the base layer. The base layer includes a stress relieving region. The magnetic tunnel junction includes a reference layer having a magnetization fixed direction, a magnetization free layer, and a tunnel barrier layer disposed between the reference layer and the magnetization free layer. The interlayer insulation layer includes an insulation material.

11 Claims, 16 Drawing Sheets

(51) Int. Cl.
G11C 11/16 (2006.01)
H01L 23/522 (2006.01)
H01L 43/02 (2006.01)
H01L 43/12 (2006.01)
H01F 41/34 (2006.01)
H01L 23/528 (2006.01)
H01L 43/10 (2006.01)

(52) U.S. Cl.
CPC .......... *H01L 23/5226* (2013.01); *H01L 43/02* (2013.01); *H01L 43/12* (2013.01); *G11C 11/1673* (2013.01); *G11C 11/1675* (2013.01); *H01L 43/10* (2013.01)

(56) References Cited

U.S. PATENT DOCUMENTS

| | | | |
|---|---|---|---|
| 2012/0088125 A1 | 4/2012 | Nishiyama et al. | |
| 2012/0091548 A1 | 4/2012 | Sukegawa et al. | |
| 2012/0217594 A1* | 8/2012 | Kajiyama | G11C 11/161 257/421 |
| 2013/0001652 A1 | 1/2013 | Yoshikawa et al. | |
| 2013/0221461 A1 | 8/2013 | Sukegawa et al. | |
| 2013/0302912 A1* | 11/2013 | Zhong | H01L 43/12 438/3 |
| 2014/0340961 A1 | 11/2014 | Ohno et al. | |
| 2015/0243583 A1 | 8/2015 | Li et al. | |
| 2016/0064649 A1* | 3/2016 | Watanabe | H01L 43/02 257/421 |
| 2019/0178956 A1* | 6/2019 | Sasaki | G11C 11/1659 |
| 2019/0180900 A1* | 6/2019 | Sasaki | H01F 10/3259 |
| 2019/0214549 A1* | 7/2019 | Tang | H01L 43/10 |

FOREIGN PATENT DOCUMENTS

| | | |
|---|---|---|
| JP | 2013-069865 A | 4/2013 |
| JP | 5586028 B2 | 9/2014 |
| JP | 5988019 B2 | 9/2016 |
| WO | 2013/069091 A1 | 5/2013 |

* cited by examiner

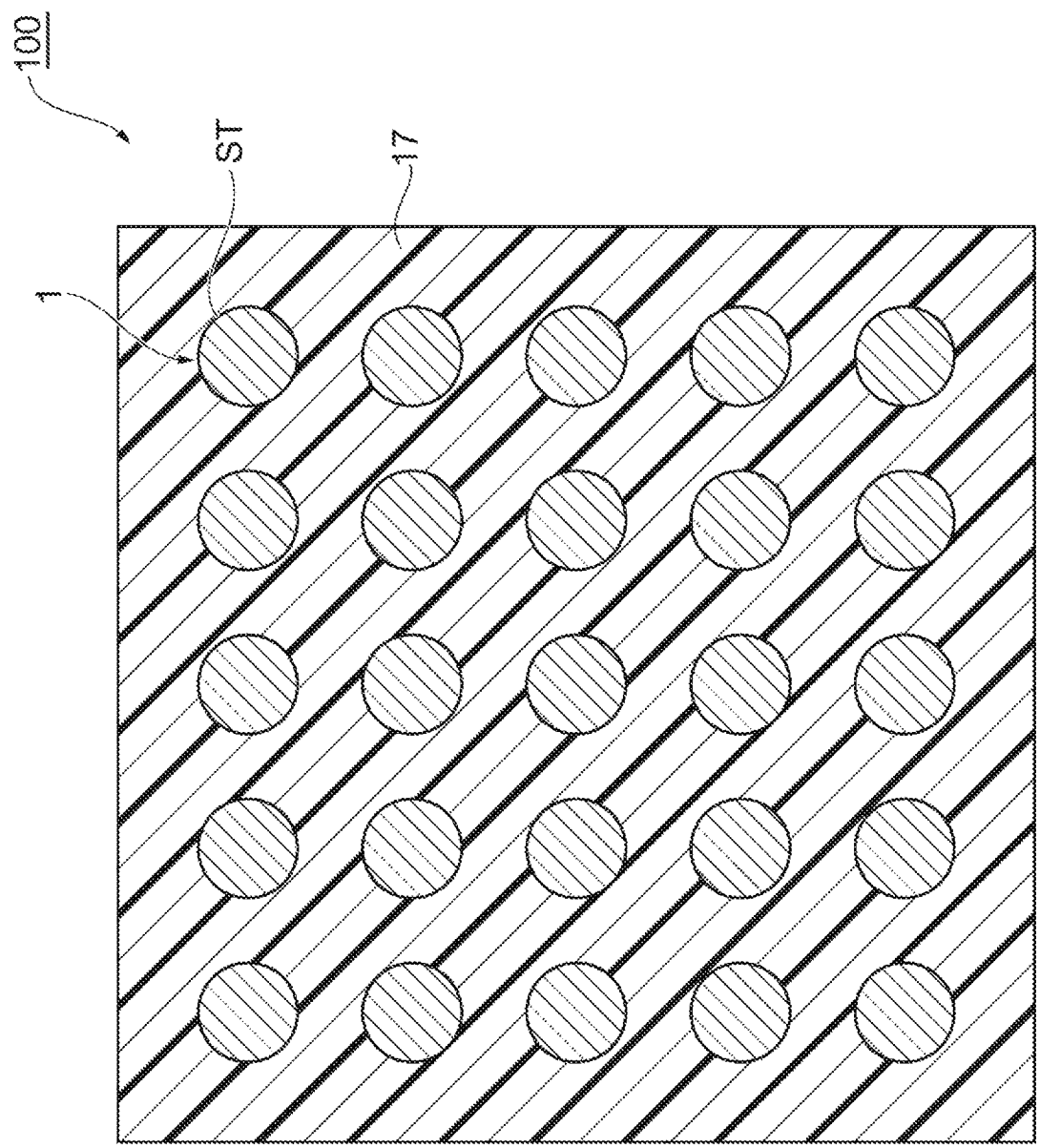
Fig.1
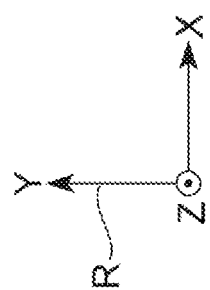

TUNNEL MAGNETORESISTIVE EFFECT ELEMENT, MAGNETIC MEMORY, AND BUILT-IN MEMORY

TECHNICAL FIELD

The present disclosure relates to a tunnel magnetoresistive effect element, a magnetic memory, and an built-in memory.

BACKGROUND ART

Magnetoresistive effect elements such as a giant magnetoresistive effect (GMR) element and a tunnel magnetoresistive effect (TMR) element having a configuration in which a reference layer as a magnetization fixed layer, a non-magnetic spacer layer, and a magnetization free layer are stacked in this order are known. Among the magnetoresistive effect elements, the TMR element that uses an insulation layer (tunnel barrier layer) as the non-magnetic spacer layer generally has high element resistance but can realize a high magnetoresistive (MR) ratio, compared to the GMR element that uses a conductive layer as the non-magnetic spacer layer. Thus, the TMR element has drawn attention as an element used in a magnetic sensor, a magnetic head, a magnetoresistive random access memory (MRAM), and the like (for example, Patent Literatures 1 and 2 below).

A technology called "spin injection magnetization reversal" in which a spin transfer torque (STT) is applied to the magnetization free layer from electron spins by causing a spin-polarized current to flow through the magnetization free layer is known as a method of reversing the magnetization direction of the magnetization free layer of the TMR element. For example, applying this technology to the MRAM can reduce the size of a memory cell and thus can achieve high density for the reason that an interconnect for magnetic field generation for reversing the magnetization direction of the magnetization free layer is not necessary. Generally, the MRAM that uses the magnetization reversal technology based on the STT is called an "STT-MRAM".

In the TMR element, the flatness of the magnetic tunnel junction is important. The distance in which a spin-polarized current flows through the tunnel barrier layer is, for example, decreased as the flatness of the tunnel barrier layer included in the magnetic tunnel junction is improved. In the TMR element, such a decrease in distance suppresses a decrease in the degree of spin polarization in the spin-polarized current. Since a voltage is uniformly applied to the tunnel barrier layer more easily as the flatness of the tunnel barrier layer is improved, a current that occurs in the in-plane direction of the tunnel barrier layer is suppressed, and a high MR ratio is achieved. In the TMR element in which the flatness of the tunnel barrier layer is improved, local application of a voltage to the tunnel barrier layer is reduced. Thus, the occurrence of breakdown that damages the tunnel barrier layer is suppressed.

CITATION LIST

Patent Literature

[Patent Literature 1] Japanese Patent No. 5586028
[Patent Literature 2] Japanese Patent No. 5988019

SUMMARY

The TMR element can include a base layer on the upper surface of a via interconnect part and include the magnetic tunnel junction including the tunnel barrier layer on the surface of the base layer. When the upper surface of the via interconnect part, for example, has a recessed region and/or a protruding region, the base layer disposed on the upper surface of the via interconnect part may have a surface of which the flatness is decreased by a stress that is caused by the recess and/or the protrusion on the upper surface of the via interconnect part. When the magnetic tunnel junction is disposed on the surface of the base layer of which the flatness is decreased, the surface of the base layer of which the flatness is decreased may be reflected on the tunnel barrier layer included in the magnetic tunnel junction, and the flatness of the tunnel barrier layer may be decreased. In order to improve the flatness of the tunnel barrier layer, the flatness of the surface of the base layer needs to be improved.

The present disclosure is conceived in view of the above problem. An object of the present disclosure is to provide a TMR element in which the flatness of a tunnel barrier layer is improved. In addition, an object of the present disclosure is to provide a magnetic memory that includes the TMR element, and a built-in memory that includes the magnetic memory.

In order to resolve the above problem, a tunnel magnetoresistive effect element (TMR element) according to one aspect of the present disclosure includes a base layer that is disposed on an upper surface of a via interconnect part, a magnetic tunnel junction that is disposed on a surface of the base layer, and an interlayer insulation layer that covers side surfaces of the via interconnect part and the base layer. The base layer includes a stress relieving region. The magnetic tunnel junction includes a reference layer having a magnetization fixed direction, a magnetization free layer, and a tunnel barrier layer disposed between the reference layer and the magnetization free layer. The interlayer insulation layer includes an insulation material.

In the TMR element according to one aspect of the present disclosure, the base layer disposed on the upper surface of the via interconnect part includes the stress relieving region. Even when a recess and/or a protrusion is present on the upper surface of the via interconnect part, the stress relieving region relieves a stress that is caused in the base layer by the recess and/or the protrusion. Since the stress caused in the base layer is relieved, the flatness of the surface of the base layer is improved. Since the magnetic tunnel junction is disposed on the surface of the base layer, the flatness of the tunnel barrier layer included in the magnetic tunnel junction is improved. A voltage is uniformly applied to the tunnel barrier layer of which the flatness is improved. Thus, a current that occurs in the in-plane direction is suppressed, and a high MR ratio is achieved. Since local application of a voltage to the tunnel barrier layer is reduced, the occurrence of breakdown is suppressed, and the durability of the tunnel barrier layer is improved.

In the TMR element according to one aspect of the present disclosure, the stress relieving region may include a plurality of cracks. Accordingly, the stress relieving region relieves the stress caused in the base layer. Consequently, a strain that is caused in the magnetic tunnel junction is relieved. The TMR element can realize a high MR ratio and high durability.

In the TMR element according to one aspect of the present disclosure, the base layer may have a thickness that is greater in a peripheral region of the upper surface of the via interconnect part than in a central region of the upper surface of the via interconnect part. The base layer may include the stress relieving region in the peripheral region of the upper surface of the via interconnect part. Accordingly, in the base layer, the stress relieving region such as a crack is disposed in the peripheral region in which the thickness of the base layer is greater than that in the central region, and the stress caused in the base layer is relieved.

In the TMR element according to one aspect of the present disclosure, when a width of the base layer is denoted by WU, and the thickness of the base layer in the peripheral region of the upper surface of the via interconnect part is denoted by TE, the base layer may have the width WU that satisfies Expression (1).

$$WU > 16.4 \times TE \tag{1}$$

In the in-plane direction of the base layer, the base layer can have the width WU that is greater than 16.4 times the thickness TE of the base layer in the peripheral region of the upper surface of the via interconnect part. When the base layer has the width WU of such a magnitude, the stress relieving region such as a crack is disposed in the base layer in the peripheral region, and the stress caused in the base layer is relieved.

In the TMR element according to one aspect of the present disclosure, the base layer may have a width that is greater than a width of the tunnel barrier layer. Accordingly, the stress relieving region that is a crack is disposed in the base layer in the peripheral region, and the stress caused in the base layer is relieved.

In the TMR element according to one aspect of the present disclosure, a lower surface of the tunnel barrier layer may have a difference of less than or equal to 2 nm between a height of the lower surface in a central region of the upper surface of the via interconnect part and the height of the lower surface in a peripheral region of the upper surface of the via interconnect part. Accordingly, the magnetoresistance ratio and the durability of the TMR element are improved.

In the TMR element according to one aspect of the present disclosure, the stress relieving region may extend toward the surface of the base layer from an inner surface of the base layer. Accordingly, the stress relieving region such as a crack extends toward the surface of the base layer from the inner surface of the base layer, and the flatness of the surface of the base layer is improved.

In the TMR element according to one aspect of the present disclosure, an upper end of the stress relieving region may be positioned between the inner surface of the base layer and the surface of the base layer. Accordingly, since the stress relieving region such as a crack does not reach the surface of the base layer, the surface of the base layer is a flat surface.

In the TMR element according to one aspect of the present disclosure, the base layer may include at least one nitride selected from a group consisting of Nb—N, Ta—N, Ti—N, V—N, and Zr—N. Accordingly, the base layer includes the nitride, and the flatness of the surface of the base layer is improved.

In the TMR element according to one aspect of the present disclosure, the base layer may include at least one oxide selected from a group consisting of $NaRh_2O_4$, $NaV_2O_4$, $RuO_2$, $SrRuO_2$, $ReO_3$, and $IrO_2$. Accordingly, the base layer includes the oxide, and the flatness of the surface of the base layer is improved.

In the TMR element according to one aspect of the present disclosure, the base layer may include at least one nitride selected from a group consisting of Nb—N, Ta—N, Ti—N, V—N, and Zr—N, and at least one oxide selected from a group consisting of $NaRh_2O_4$, $NaV_2O_4$, $RuO_2$, $SrRuO_2$, $ReO_3$, and $IrO_2$. Accordingly, the base layer includes the nitride and the oxide, and the flatness of the surface of the base layer is improved.

In addition, a magnetic memory according to one aspect of the present disclosure includes any of the TMR elements as a storage element.

In addition, a built-in memory according to one aspect of the present disclosure includes the magnetic memory.

According to the present disclosure, a TMR element having an improved flatness of a tunnel barrier layer is provided. In addition, a magnetic memory that includes the TMR element, and a built-in memory that includes the magnetic memory are provided.

BRIEF DESCRIPTION OF DRAWINGS

FIG. 1 is a cross-sectional plan view of an MRAM that includes a TMR element of an embodiment.

DESCRIPTION OF EMBODIMENTS

Figure 2:
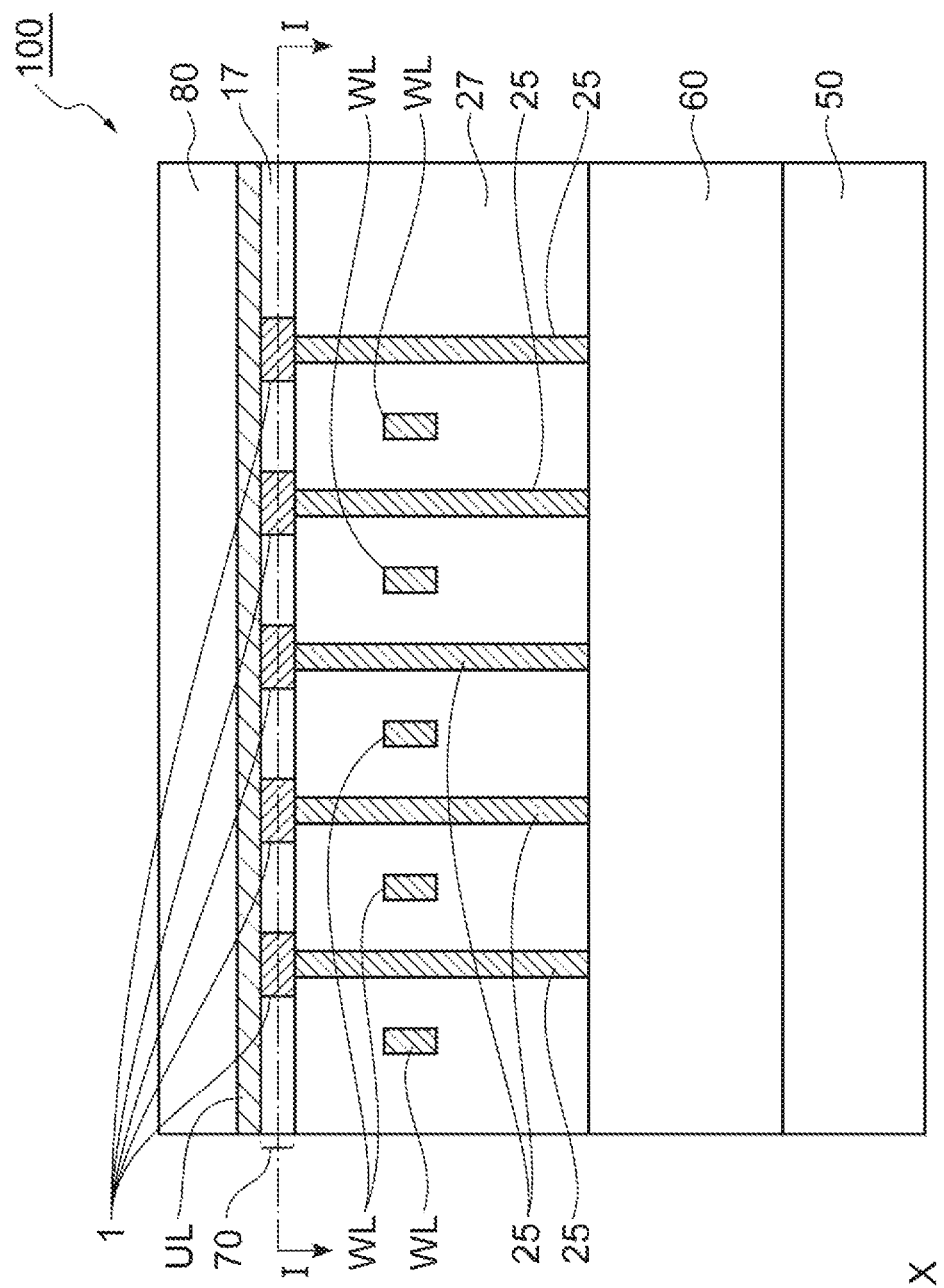
FIG. 2 is a schematic view of a vertical cross section of the MRAM according to the embodiment.

Hereinafter, an embodiment of the present disclosure will be described in detail with reference to the appended drawings. In each drawing, the same reference signs are used for the same elements if possible. In addition, the ratio of dimensions in constituents and among constituents in the drawings is arbitrarily set for easy understanding of the drawings.

FIG. 1 is a cross-sectional plan view of a magnetic memory (magnetoresistive random access memory; MRAM) that includes a tunnel magnetoresistive effect element (TMR element) according to the present embodiment. FIG. 2 is a schematic view of a vertical cross section of the MRAM according to the present embodiment. FIG. 1 corresponds to a cross-section of an MRAM 100 taken along line I-I in FIG. 2. A three-dimensional orthogonal coordinate system R is illustrated in FIG. 1 and the subsequent drawings when necessary. When the three-dimensional orthogonal coordinate system R is used, the thickness direction of each layer is set along a Z-axis direction, and two orthogonal axes that are perpendicular to the Z axis are set along an X axis and a Y axis.

As illustrated in FIG. 1, the MRAM 100 of the present embodiment includes a plurality of TMR elements 1 that are arranged in an array form (five rows and five columns in FIG. 1) in an XY plane. Each of the plurality of TMR elements 1 functions as a storage element of the MRAM 100. As will be described in detail later, each TMR element 1 includes a stack portion ST and a side wall portion 17 that covers the side surface of the stack portion ST. In addition, as illustrated in FIG. 2, the MRAM 100 includes a semiconductor substrate 50, a transistor array 60, a via interconnect part 25, an interlayer insulation layer 27, a word line WL, a TMR element array 70 including the side wall portion 17, an upper interconnect UL, and an insulation body 80 that covers the upper surface of the upper interconnect UL. In FIG. 1 and FIG. 2, other electrical interconnects that connect the upper interconnect UL to the transistor array 60 are not illustrated except the word line WL.

The transistor array 60 is disposed on the principal surface of the semiconductor substrate 50 that extends along the XY plane. The MRAM 100 includes a plurality of transistors T (refer to FIG. 3) that are disposed in an array form in order to drive the plurality of TMR elements 1. A plurality of the via interconnect parts 25 and a plurality of the word lines WL are disposed on the transistor array 60. Each via interconnect part 25 electrically connects one of the plurality of transistors T of the transistor array 60 to the plurality of TMR elements 1 of the TMR element array 70. The plurality of via interconnect parts 25 and the plurality of word lines WL are embedded in the interlayer insulation layer 27 and are insulated from each other by the interlayer insulation layer 27.

Figure 3:
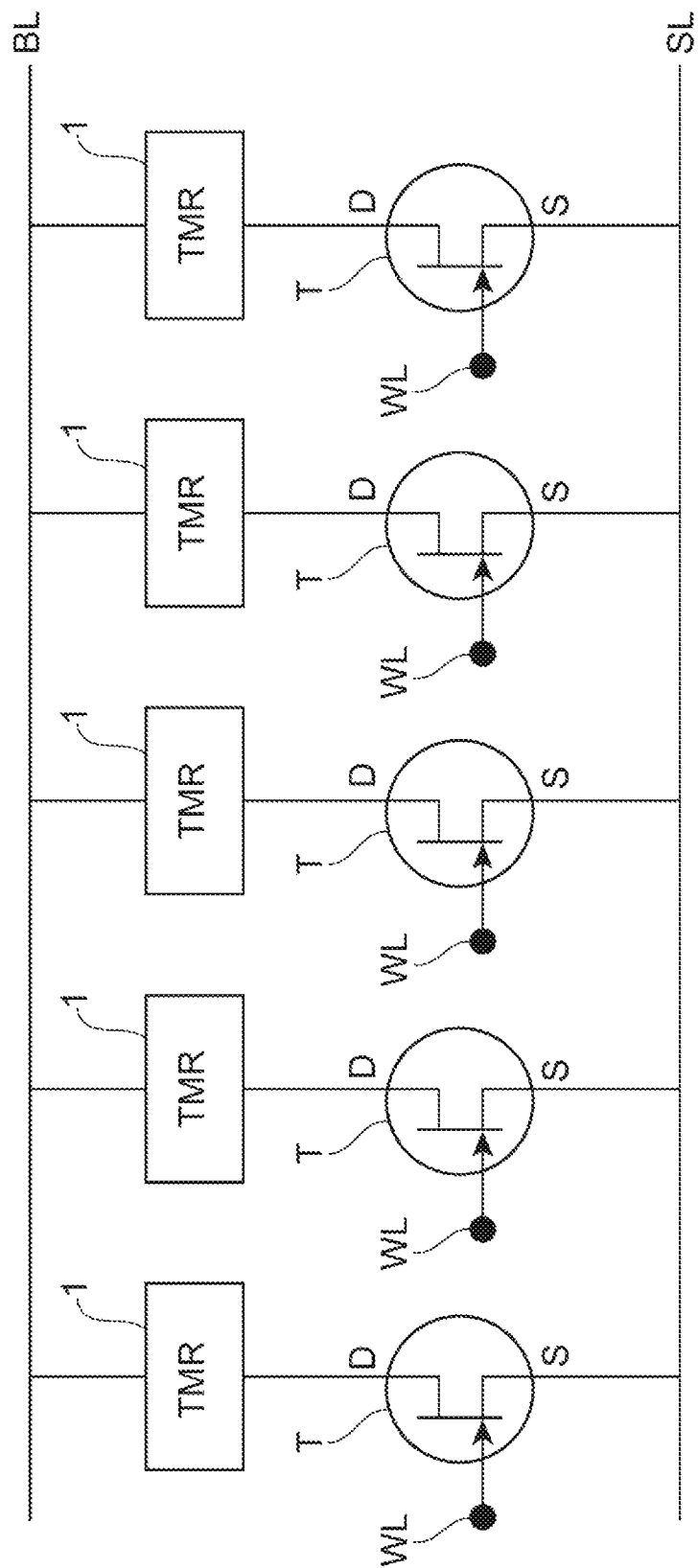
FIG. 3 is a view illustrating the electrical connection of the MRAM of the embodiment.

FIG. 3 is a view illustrating the electrical connection of the MRAM of the present embodiment. In FIG. 3, only electrical connection related to five TMR elements 1 of the plurality of TMR elements 1 of the TMR element array 70 is illustrated.

As illustrated in FIG. 3, one end of each TMR element 1 is electrically connected to a drain D of each transistor T, respectively. The other end of each TMR element 1 is electrically connected to a bit line BL. The bit line BL is included in the upper interconnect UL (refer to FIG. 2). The gate of each transistor T is electrically connected to each word line WL respectively, and a source S of each transistor T is electrically connected to a source line SL. Each transistor T functions as the storage element of the MRAM 100. One transistor T and one transistor T electrically connected thereto constitute one memory cell.

When data is written into the memory cell of the MRAM 100, a selection voltage is applied to the word line WL that corresponds to the TMR element 1 of a write target. Then, in a state where this TMR element 1 is set to ON state, a voltage is applied between the bit line BL and the source line SL such that a current of which the polarity corresponds to the write data ("1" or "0") flows through the TMR element 1. The magnitude of the voltage applied at this point is set to a magnitude that may cause spin injection magnetization reversal in a magnetization free layer 7 (refer to FIG. 4) of the TMR element 1 as will be described later. Accordingly, the magnetization direction of the magnetization free layer 7 (refer to FIG. 4) of the TMR element 1 is set to a direction corresponding to the write data.

When data is read from the memory cells of the MRAM 100, a selection voltage is applied to the word line WL that corresponds to the TMR element 1 of a read target. Then, in a state where this TMR element 1 is set to ON state, a voltage that is smaller than the voltage at the time of writing is applied between the bit line BL and the source line SL. Accordingly, since a current of which the magnitude corresponds to data stored in the TMR element 1 flows between the bit line BL and the source line SL through the TMR element 1, the data is read by detecting the current value.

Figure 4:
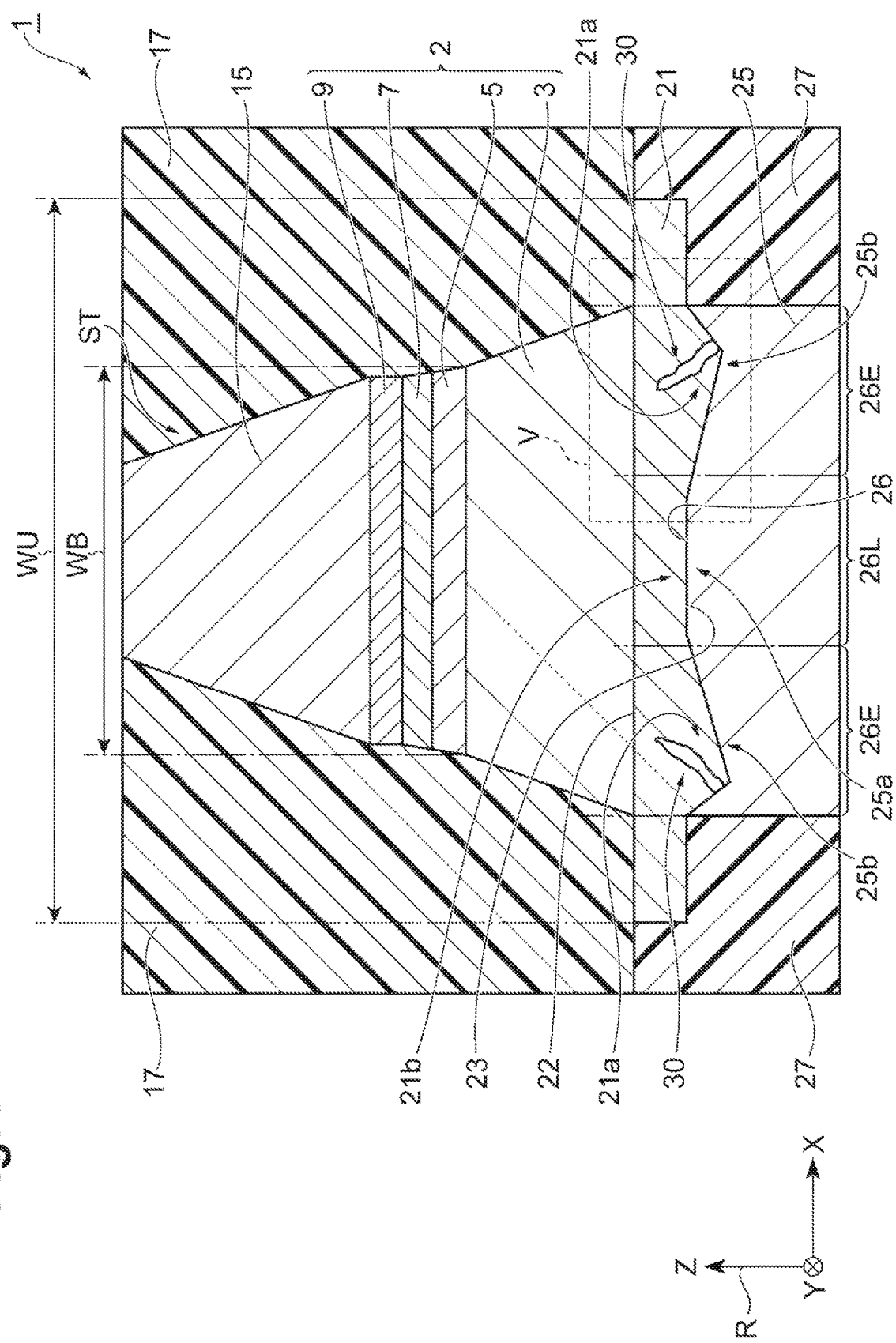
FIG. 4 is a cross-sectional view in the vicinity of the TMR element of the MRAM of the embodiment.
Figure 5:
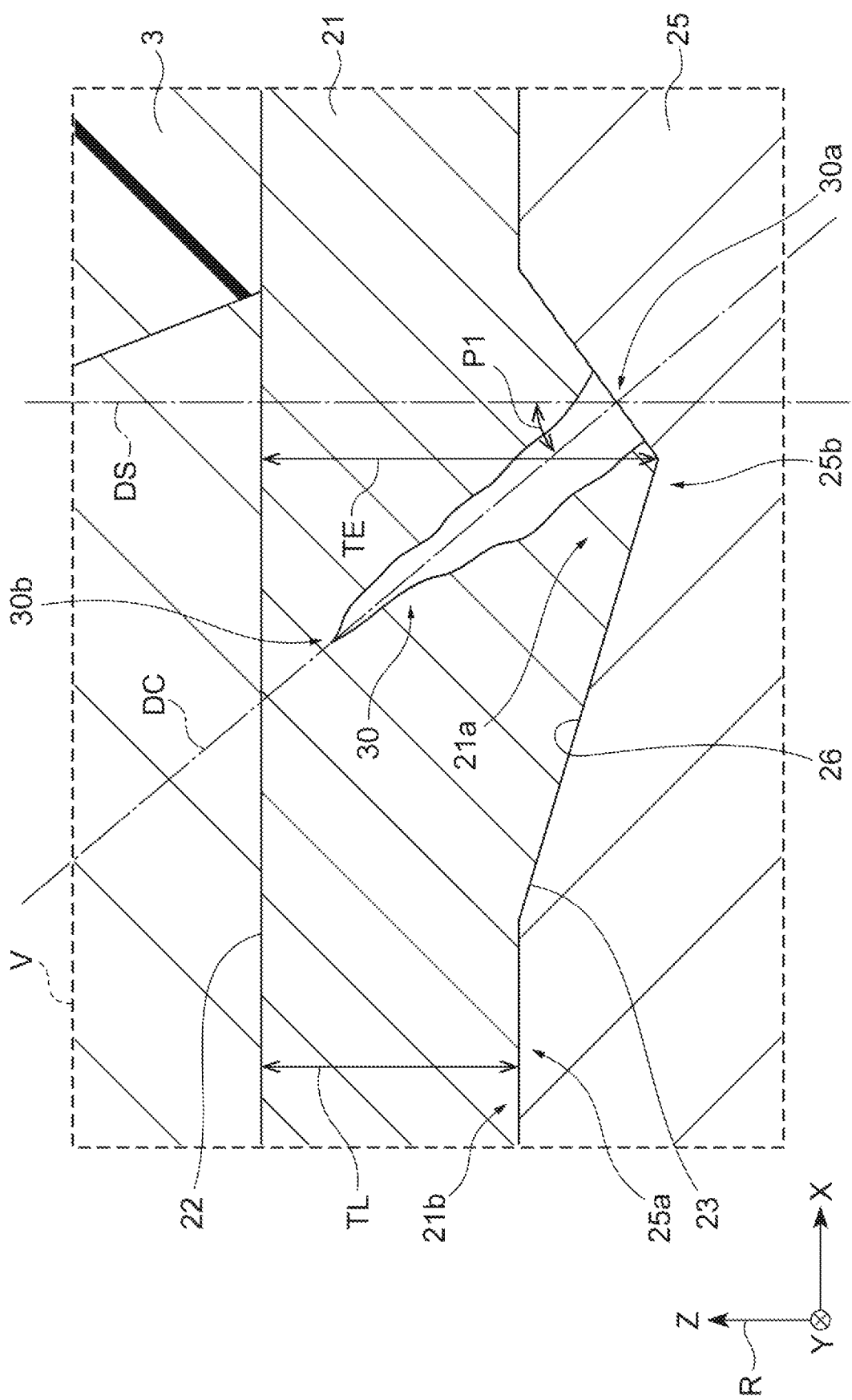
FIG. 5 is a cross-sectional view in the vicinity of the TMR element of the MRAM of the embodiment.

Next, a detailed configuration of each TMR element 1 of the present embodiment will be described. FIG. 4 is a cross-sectional view in the vicinity of the TMR element of the MRAM of the present embodiment. FIG. 4 illustrates a cross-section in the vicinity of one TMR element 1 in the vertical cross-section of the MRAM 100 illustrated in FIG. 2. FIG. 5 is an enlarged view of a region V in FIG. 4.

As illustrated in FIG. 4 and FIG. 5, the TMR element 1 includes a base layer 21, the stack portion ST, the side wall portion 17, and the interlayer insulation layer 27. The base layer 21 is disposed on an upper surface 26 of the via interconnect part 25. The stack portion ST is disposed on a surface 22 of the base layer 21. The side wall portion 17 covers the side surface of the stack portion ST. The interlayer insulation layer 27 covers the side surface of each of the via interconnect part 25 and the base layer 21.

The stack portion ST is configured with a plurality of layers that are stacked along the Z-axis direction which is a stack direction. For example, the stack portion ST includes a magnetic tunnel junction 2 and a mask layer 15. The magnetic tunnel junction 2 is disposed on the surface 22 of the base layer 21. The mask layer 15 is disposed on the magnetic tunnel junction 2. The magnetic tunnel junction 2 includes a reference layer 3, the magnetization free layer 7, and a tunnel barrier layer 5. The reference layer 3 has a magnetization fixed direction and functions as a magnetization fixed layer. The tunnel barrier layer 5 is disposed between the reference layer 3 and the magnetization free layer 7. The reference layer 3 is, for example, disposed on the surface 22 of the base layer 21. In the TMR element 1, the magnetization direction of the magnetization free layer can be reversed using a spin-polarized current that flows through the magnetization free layer via the tunnel barrier layer. The magnetic tunnel junction 2 further includes a perpendicular magnetization inducing layer 9 when necessary. The perpendicular magnetization inducing layer 9 is, for example, disposed on the side of the magnetization free layer 7 opposite to the tunnel barrier layer 5 side.

The base layer 21 is disposed on the upper surface 26 of the via interconnect part 25 in order to improve the flatness of each layer of the stack portion ST, particularly, the tunnel barrier layer 5. The surface 22 of the base layer 21 can be polished by chemical mechanical polishing (CMP) and the like, and is flattened using these polishing methods. The flatness of the surface 22 of the base layer 21 can be higher than the flatness of the upper surface 26 of the via interconnect part 25. The surface 22 of the base layer 21 has high flatness and extends along the XY plane. The stack portion ST is formed on the surface 22.

The via interconnect part 25 is formed of a conductive material. The via interconnect part 25 is, for example, formed of a metal such as Cu. The base layer 21 is formed of a conductive material. The base layer 21 is, for example, formed of a conductive oxide, a conductive nitride, a conductive oxynitride, or a silicide. Thus, the lower surface of a reference layer 3 that is one end of the TMR element 1 of the present embodiment is electrically connected to the drain D (refer to FIG. 3) of the transistor T through the base layer 21 and the via interconnect part 25.

For example, the via interconnect part 25 includes a protrusion 25a in a central region 26L of the upper surface 26, and a recess 25b in a peripheral region 26E of the upper surface 26. Since the base layer 21 is disposed on the upper surface 26 of the via interconnect part 25, the base layer 21 has an inner surface 23 of which the shape corresponds to the protrusion 25a and the recess 25b on the upper surface 26 of the via interconnect part 25. For example, the inner surface 23 of the base layer 21 includes a recess 21b that corresponds to the protrusion 25a of the via interconnect part 25 in the central region 26L of the upper surface 26 of the via interconnect part 25. In addition, the inner surface 23 of the base layer 21, for example, includes a protrusion 21a that corresponds to the recess 25b of the via interconnect part 25 in the peripheral region 26E of the upper surface 26 of the via interconnect part 25.

For example, when the via interconnect part 25 includes the protrusion 25a in the central region 26L of the upper surface 26 and the recess 25b in the peripheral region 26E of the upper surface 26 as a result of the base layer 21 having the inner surface 23 that corresponds to the shape of the upper surface 26 of the via interconnect part 25, the base layer 21 has a thickness that is greater in the peripheral region 26E of the upper surface 26 of the via interconnect part 25 than in the central region 26L of the upper surface 26 of the via interconnect part. That is, a thickness TE of the base layer 21 in the peripheral region 26E can be greater than a thickness TL of the base layer 21 in the central region 26L. The base layer 21 can include a stress relieving region 30 in the peripheral region 26E of the upper surface 26 of the via interconnect part 25. In the base layer 21, the stress relieving region 30 that is a crack is disposed in the peripheral region 26E in which the thickness of the base layer 21 is greater than that in the central region 26L, and a stress that is caused in the base layer 21 is relieved.

The base layer 21 disposed on the upper surface 26 of the via interconnect part 25 includes the stress relieving region 30. Even when the recess 25b and/or the protrusion 25a is present on the upper surface 26 of the via interconnect part 25, the stress relieving region 30 relieves a stress that is caused in the base layer 21 by the recess 25b and/or the protrusion 25a. Since the stress caused in the base layer 21 is relieved, the flatness of the surface 22 of the base layer 21 is improved. Since the magnetic tunnel junction 2 is disposed on the surface 22 of the base layer 21, the flatness of the tunnel barrier layer 5 included in the magnetic tunnel junction 2 is improved. A voltage is uniformly applied to the tunnel barrier layer 5 of which the flatness is improved. Thus, a current that occurs in the in-plane direction is suppressed, and a high MR ratio is achieved. Since local application of a voltage to the tunnel barrier layer 5 is reduced, the occurrence of breakdown is suppressed, and the durability of the tunnel barrier layer 5 is improved.

The stress relieving region 30 can include one or a plurality of cracks. The crack is, for example, a split, a breakage or a microcrack except a crack caused by a dislocation in a crystal. The base layer 21 can have a vacuum space or a depressurized space in the crack. For example, the result of observing the stress relieving region 30 using a transmission electron microscope (TEM) shows that a crystal is not present in the stress relieving region 30. The stress relieving region 30 relieves the stress caused in the base layer 21. Consequently, a strain that is caused in the magnetic tunnel junction 2 is relieved. The TMR element 1 can realize a high MR ratio and high durability.

In the TMR element 1, when the width of the base layer 21 is denoted by WU, and the thickness of the base layer 21 in the peripheral region 26E of the upper surface 26 of the via interconnect part 25 is denoted by TE, the base layer 21 can have the width WU that satisfies Expression (1).

$$WU > 16.4 \times TE \qquad (1)$$

When the base layer 21 has the width WU of such a magnitude, the stress relieving region 30 such as a crack is observed in the base layer 21 in the peripheral region 26E using the TEM. In the observation of the stress relieving region 30 using the TEM, the magnification of the TEM is, for example, 500,000 to 5,000,000. The stress relieving region 30 is disposed in the base layer 21 in the peripheral region 26E, and the stress caused in the base layer 21 is relieved.

In the present embodiment, when the ratio (WU/TE) of the width WU to the thickness TE is, for example, 8.0 to 16.4, the stress relieving region 30 is slightly observed using the TEM or the like. When the ratio (WU/TE) of the width WU to the thickness TE is, for example, 2.0 to 8.0, the stress relieving region 30 is almost not observed using the TEM or the like.

The base layer 21 can have the width WU that is greater than that of the tunnel barrier layer 5. That is, the width WU of the base layer 21 can be greater than a width WB of the tunnel barrier layer 5. When the base layer 21 has the width WU that is greater than the width WB in the in-plane direction of the tunnel barrier layer 5, the stress relieving region 30 that is a crack is disposed in the base layer 21 in the peripheral region 26E, and the stress caused in the base layer 21 is relieved.

As illustrated in FIG. 5, in the base layer 21 in the peripheral region 26E, the crack that is the stress relieving region 30 can extend toward the surface 22 from the inner surface 23 of the base layer 21. Accordingly, the inner surface 23 of the base layer 21 can have an opening portion 30a, and the base layer 21 can have a deepest portion 30b that is the upper end of the crack. In FIG. 5, an extending axis DC of the crack that passes through approximately the center of the opening portion 30a and the deepest portion 30b can form an angle P1 with a stack axis (stack direction) DS. The angle P1 can be, for example, within a range of 10 degrees to 35 degrees.

Since the stress relieving region 30 such as a crack can extend toward the surface 22 of the base layer 21 from the inner surface 23 of the base layer 21, the extending crack improves the flatness of the surface 22 of the base layer 21. Furthermore, in the base layer 21 in the peripheral region 26E, the deepest portion 30b of the stress relieving region 30 can be positioned between the inner surface 23 of the base layer 21 and the surface 22 of the base layer 21. Since the stress relieving region 30 such as a crack does not reach the surface 22 of the base layer 21, the surface 22 of the base layer 21 is a flat surface.

When the TMR element 1 is manufactured, the surface 22 of the base layer 21 is polished using chemical mechanical polishing (CMP) along with the interlayer insulation layer 27 that covers the side surface of the base layer 21. The hardness of the base layer 21 may not be equal to the hardness of the interlayer insulation layer 27. When the hardness of the base layer 21 is, for example, higher than the hardness of the interlayer insulation layer 27, the surface 22 of the base layer 21 is removed more slowly than a surface 28 of the interlayer insulation layer 27. Thus, a protrusion may be formed on the surface 22 of the base layer 21 in the central region 26L. In addition, when the hardness of the surface 22 of the base layer 21 is, for example, lower than the hardness of the surface 28 of the interlayer insulation layer 27, the surface 22 of the base layer 21 is removed faster than the surface 28 of the interlayer insulation layer 27. Thus, a recess may be formed on the surface 22 of the base layer 21 in the central region 26L.

Figure 6:
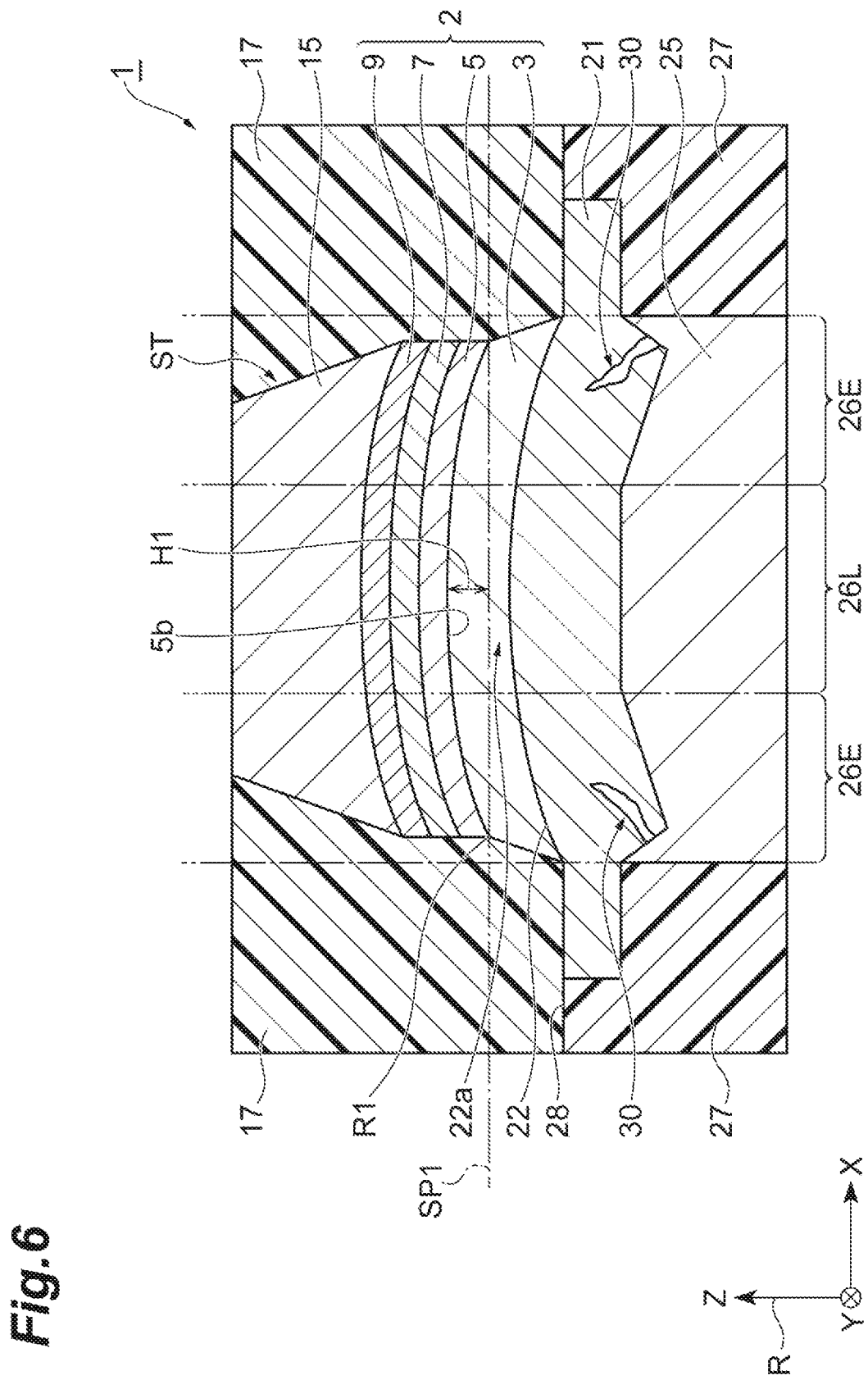
FIG. 6 is a cross-sectional view in the vicinity of the TMR element of the MRAM of the embodiment.

FIG. 6 is a cross-sectional view in the vicinity of the TMR element of the MRAM of the present embodiment, and corresponds to FIG. 4. FIG. 6 is a view when a protrusion is formed on the surface 22 of the base layer 21. The formed protrusion is illustrated in an enlarged manner.

As illustrated in FIG. 6, when the hardness of the base layer 21 is higher than the hardness of the interlayer insulation layer 27, the height of the surface 22 of the base layer 21 can be monotonously increased along a direction to the central region 26L from the peripheral region 26E. Consequently, the height of the surface 22 of the base layer 21 in the central region 26L is higher than the height of the surface 22 of the base layer 21 in the peripheral region 26E. The height of the surface 22 of the base layer 21 is defined in the thickness direction (Z-axis direction) of the base layer 21.

Since the magnetic tunnel junction 2 is disposed on the surface 22 of the base layer 21, the height of the surface of each layer included in the magnetic tunnel junction 2 may be changed in accordance with the change in the height of the surface 22 of the base layer 21. Thus, the height of a lower surface 5b of the tunnel barrier layer 5 in the central region 26L may be, for example, greater than the height of the lower surface 5b of the tunnel barrier layer 5 in the peripheral region 26E.

In the present embodiment, the tunnel barrier layer 5 can have the lower surface 5b for which the difference between the height of the lower surface 5b in the central region 26L and the height of the lower surface 5b in the peripheral region 26E is less than or equal to 2 nm. That is, the difference between the maximum value of the height of the lower surface 5b in the central region 26L and the minimum value of the height of the lower surface 5b in the peripheral region 26E can be less than or equal to 2 nm. The height of the lower surface 5b is defined in the thickness direction (Z-axis direction) of the tunnel barrier layer 5. In one embodiment, when the maximum value of the height of the lower surface 5b in the central region 26L is denoted by H1, the height H1 in FIG. 6 is defined as the distance to the lower surface 5b from a reference plane SP1 that includes an end portion R1 at which the height of the lower surface 5b in the peripheral region 26E has the minimum value. The reference plane SP1 extends in the width direction (X-axis direction) of the tunnel barrier layer 5.

In the TMR element 1, flatness is improved such that the height H1 of the lower surface 5b of the tunnel barrier layer 5 is less than or equal to 2 nm. That is, the difference between the height of the lower surface 5b of the tunnel barrier layer 5 in the central region 26L and that in the peripheral region 26E is less than or equal to 2 nm. By such improvement in flatness, a voltage can be uniformly applied to the tunnel barrier layer 5. By uniformly applying the voltage, a current that occurs in the in-plane direction is suppressed, and a high MR ratio is achieved. In addition, local application of a voltage to the tunnel barrier layer 5 is reduced. The occurrence of breakdown is suppressed, and the durability of the tunnel barrier layer 5 is improved.

When the hardness of the base layer 21 is lower than the hardness of the interlayer insulation layer 27, for example, the height of the surface 22 of the base layer 21 in the central region 26L may be less than the height of the surface 22 of the base layer 21 in the peripheral region 26E in the tunnel barrier layer 5. Even in this case, the difference between the height of the lower surface 5b in the central region 26L and the height of the lower surface 5b in the peripheral region 26E can be less than or equal to 2 nm in the tunnel bather layer 5.

In the TMR element 1, the base layer 21 can include at least one nitride selected from a group consisting of Nb—N, Ta—N, Ti—N, V—N, and Zr—N. By including the nitride in the base layer 21, the flatness of the surface 22 of the base layer 21 is improved.

The base layer can include at least one oxide selected from a group consisting of $NaRh_2O_4$, $NaV_2O_4$, $RuO_2$, $SrRuO_2$, $ReO_3$, and $IrO_2$. By including the oxide in the base layer 21, the flatness of the surface 22 of the base layer 21 is improved.

The base layer 21 can include at least one nitride selected from a group consisting of Nb—N, Ta—N, Ti—N, V—N, and Zr—N, and at least one oxide selected from a group consisting of $NaRh_2O_4$, $NaV_2O_4$, $RuO_2$, $SrRuO_2$, $ReO_3$, and $IrO_2$. By including the nitride and the oxide in the base layer 21, the flatness of the surface 22 of the base layer 21 is improved.

In the TMR element 1, the reference layer 3 is formed of a ferromagnetic material such as Co, a Co—Fe alloy, or a Co—Fe—B alloy. The magnetization direction of the reference layer 3 is substantially fixed along the Z-axis direction. The thickness in the Z-axis direction of the reference layer 3 can be, for example, greater than or equal to 3 nm and less than or equal to 10 nm. In addition, the reference layer 3 can have a structure in which a multilayer film such as Co/Pt or Co/Ni is repeatedly stacked such that the magnetization direction of each magnetic layer is along a perpendicular direction.

The reference layer 3 can have a structure in which magnetic fields occurs in the reference layer 3 offset each other using the RKKY interaction that occurs through a thin film of Ru, Ir, or the like. This structure is a synthetic anti-ferromagnet (SAF) structure, that is, a structure that includes two ferromagnetic layers formed of a ferromagnetic material and a non-magnetic layer stacked between the two ferromagnetic layers in which the magnetization directions of the two ferromagnetic layers are coupled to each other through the non-magnetic layer in antiparallel by exchange coupling that is based on the RKKY interaction.

The tunnel barrier layer 5 is formed of an insulation material. The tunnel barrier layer 5 is preferably configured to induce perpendicular magnetic anisotropy in the magnetization free layer 7 based on the same principle as the perpendicular magnetization inducing layer 9 described later. The reason is that the perpendicular magnetization of the magnetization free layer 7 is more stable, and the film thickness of the magnetization free layer 7 can be increased. The material constituting the tunnel barrier layer 5 that may induce perpendicular magnetic anisotropy in the magnetization free layer 7 can be exemplified, for example, by MgO, ZnO, GaO$_x$, or an oxide material that has a spinel structure represented by General Formula AB$_2$O$_4$ (in the formula, A is at least one kind of element selected from a group consisting of Mg and Zn, and B is at least one kind of element selected from a group consisting of Al, Ga, and In).

The tunnel barrier layer 5 may be configured not to induce perpendicular magnetic anisotropy in the magnetization free layer 7. In this case, the tunnel barrier layer 5 can be formed of a non-magnetic metal material such as Cu or Ag, or a semiconductor material such as Si or Ge.

The thickness in the Z-axis direction of the tunnel barrier layer 5 is small enough such that a tunnel current flows through the tunnel barrier layer 5 in the Z-axis direction when a voltage is applied between the reference layer 3 and the magnetization free layer 7. The thickness in the Z-axis direction of the tunnel barrier layer 5 can be, for example, greater than or equal to 1 nm and less than or equal to 3 nm.

In addition, in the present embodiment, the tunnel barrier layer is formed of a material that induces magnetic anisotropy (perpendicular magnetic anisotropy) in the Z-axis direction in a region of the magnetization free layer 7 in the vicinity of the interface between the magnetization free layer 7 and the tunnel barrier layer 5. Accordingly, the tunnel barrier layer 5 imparts magnetic anisotropy in a direction (perpendicular direction) along the Z axis to the magnetization free layer 7 in cooperation with the perpendicular magnetization inducing layer 9 described later. When the easy magnetization axis of the magnetization free layer 7 can be sufficiently stably directed in the direction along the Z axis by the action and the like of the perpendicular magnetization inducing layer 9, the tunnel barrier layer 5 may be formed of a material that does not induce perpendicular magnetic anisotropy in the magnetization free layer 7.

The magnetization free layer 7 is formed of a ferromagnetic material such as Fe, Co—Fe, Co—Fe—B, or a ferromagnetic Heusler alloy. The magnetization direction of the magnetization free layer 7 is substantially not fixed.

The perpendicular magnetization inducing layer 9 is, for example, formed of MgO, ZnO, Ga$_2$O$_3$, or an oxide material that has a spinel structure represented by General Formula AB$_2$O$_4$ (in the formula, A is at least one kind of element selected from a group consisting of Mg and Zn, and B is at least one kind of element selected from a group consisting of Al, Ga, and In).

The perpendicular magnetization inducing layer 9 is preferably configured such that the resistance value of the perpendicular magnetization inducing layer 9 along the Z-axis direction per unit area in the XY plane is smaller than that of the tunnel barrier layer 5. Particularly, when the perpendicular magnetization inducing layer 9 is formed of an insulation material, the thickness in the Z-axis direction of the perpendicular magnetization inducing layer 9 is preferably smaller than the thickness in the Z-axis direction of the tunnel barrier layer 5.

The perpendicular magnetization inducing layer 9 is formed of a material that induces magnetic anisotropy (perpendicular magnetic anisotropy) in the direction along the Z axis in a region of the magnetization free layer 7 in the vicinity of the interface between the magnetization free layer 7 and the perpendicular magnetization inducing layer 9 based on the spin-orbit interaction. Accordingly, the perpendicular magnetization inducing layer 9 imparts magnetic anisotropy in the direction (perpendicular direction) along the Z axis to the magnetization free layer 7 in cooperation with the tunnel barrier layer 5.

The thickness of the magnetization free layer 7 in the Z-axis direction is small enough such that the easy magnetization axis of the magnetization free layer 7 is stably set in the direction along the Z axis by the function of imparting magnetic anisotropy exhibited by the tunnel barrier layer 5 and the perpendicular magnetization inducing layer 9 as described above. The thickness can be, for example, greater than or equal to 1 nm and less than or equal to 3 nm.

The mask layer 15 is stacked on the perpendicular magnetization inducing layer 9 and a leakage layer 11. The mask layer 15 is formed of a conductive material, for example, formed of a metal such as Ta, Ru, W, TaN, TiN, or CuN. The upper surface of the mask layer 15, which is the other end of the TMR element 1 of the present embodiment is electrically connected to the bit line BL (refer to FIG. 3).

The side wall portion 17 is formed of an insulation material and covers the side surface of the stack portion ST. Accordingly, the side wall portion 17 electrically insulates the stack portion ST of the TMR element 1 from the stack portions of the other TMR elements. In the present embodiment, while the side wall portion 17 is in contact with the side surfaces of all of the reference layer 3, the tunnel barrier layer 5, the magnetization free layer 7, and the mask layer 15, the side wall portion 17 may not be in contact with a part of the side surfaces thereof. The side wall portion 17 is formed of, for example, a nitride material such as SiN, or an oxynitride material such as SiON.

The interlayer insulation layer 27 is formed of an insulation material and covers the side surface of each of the via interconnect part 25 and the base layer 21. Accordingly, the interlayer insulation layer 27 electrically insulates the via interconnect part 25 and the base layer 21 from the other via interconnect parts and the other base layers. The interlayer insulation layer 27 is formed of, for example, a nitride material such as SiN, or an oxynitride material such as SiON.

A specific example of a manufacturing method for such a TMR element of the present embodiment will be described. FIG. 7 to FIG. 15 are views illustrating a cross-section for describing the specific example of the manufacturing method for the TMR element of the present embodiment. Each of FIG. 7 to FIG. 15 corresponds to the above cross-section in the vicinity of the TMR element 1 illustrated in FIG. 4. In the following specific example, a manufacturing method for the TMR element that includes the perpendicular magnetization inducing layer 9 is illustrated.

Figure 7:
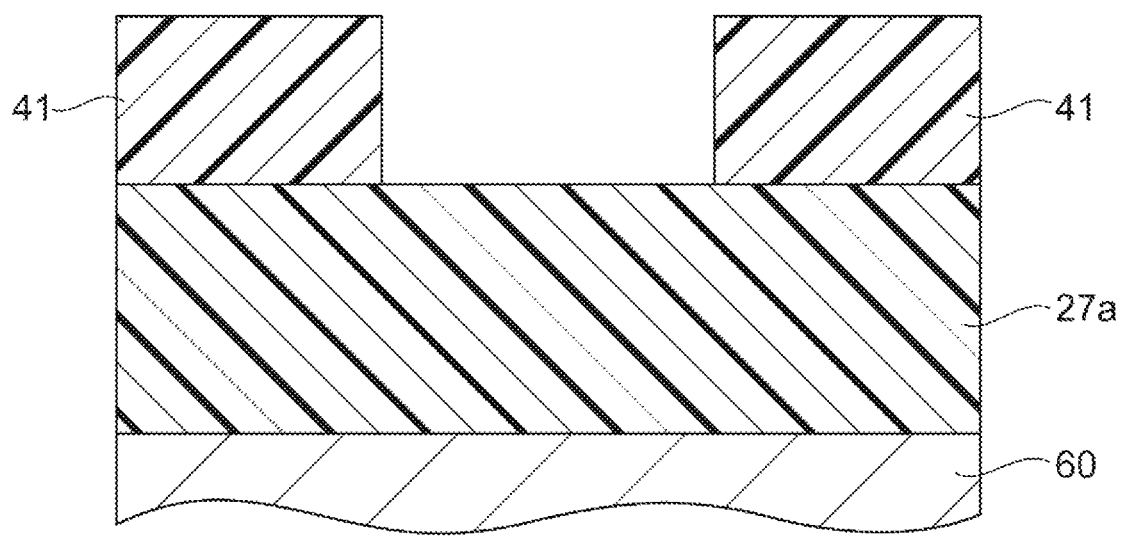
FIG. 7 is a view illustrating a cross-section for describing a specific example of a manufacturing method for the TMR element.

In the specific example of the manufacturing method, first, as illustrated in FIG. 7, a lower interlayer insulation layer 27a is formed on the whole surface on the transistor array 60. Then, a resist 41 that has an opening is formed on the lower interlayer insulation layer 27a. The lower interlayer insulation layer 27a is formed of the same material as the interlayer insulation layer 27. The opening of the resist 41 corresponds to a region in which the via interconnect part 25 described later is formed.

Figure 8:
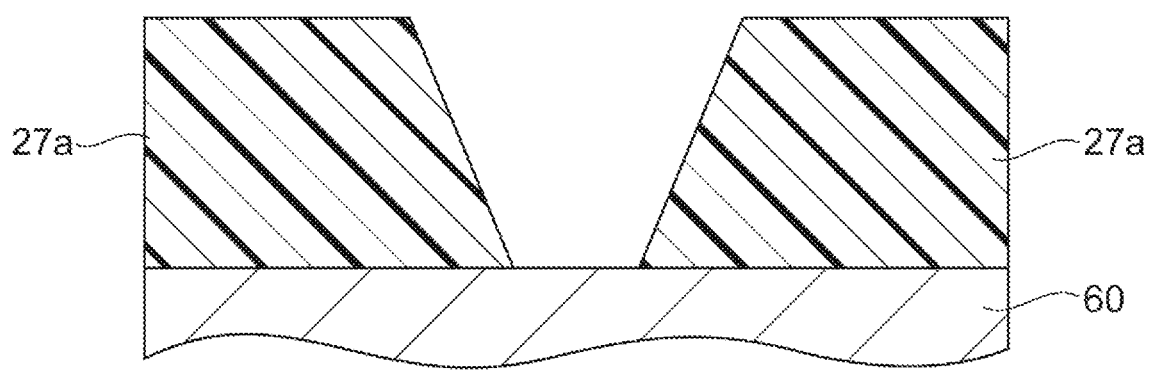
FIG. 8 is a view illustrating a cross-section for describing the specific example of the manufacturing method for the TMR element.
Figure 8:
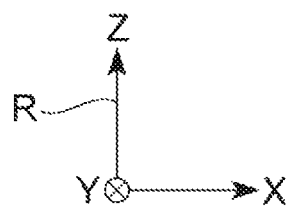

Next, as illustrated in FIG. 8, the lower interlayer insulation layer 27a is etched by dry etching such as reactive ion etching (RIE) using the resist 41 as a mask. Then, an opening that has a depth reaching the transistor array 60 is formed in the lower interlayer insulation layer 27a by removing the resist 41.

Figure 9:
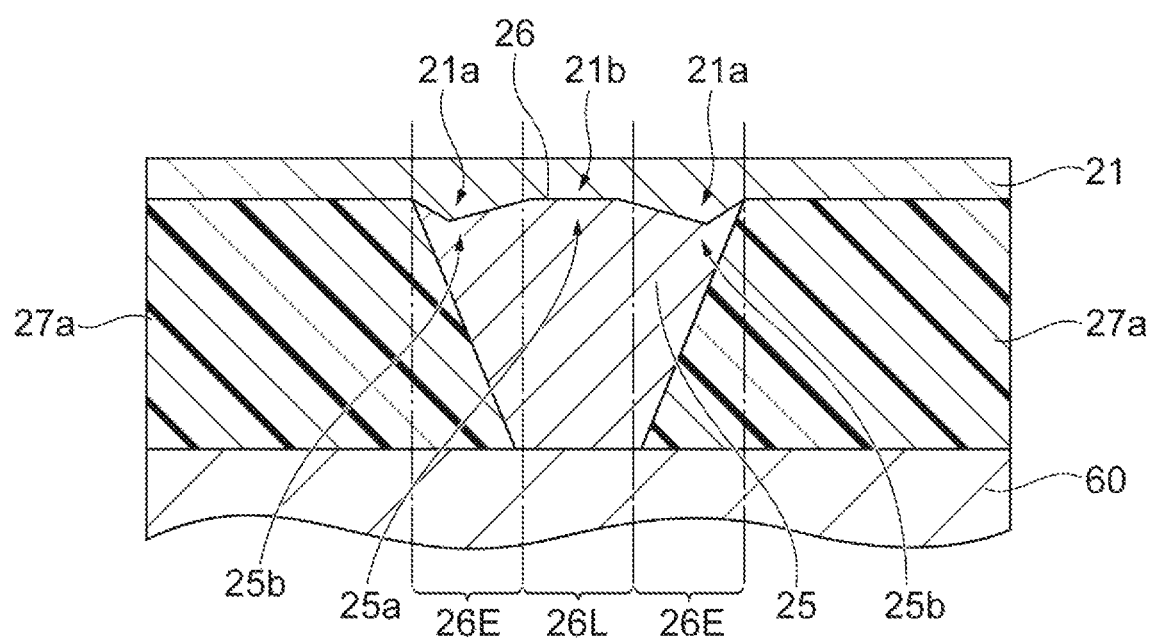
FIG. 9 is a view illustrating a cross-section for describing the specific example of the manufacturing method for the TMR element.
Figure 9:
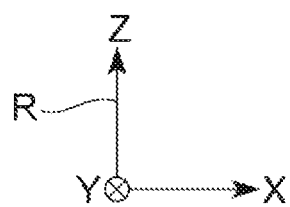

Next, as illustrated in FIG. 9, the via interconnect part 25 that is formed of a metal such as Cu is formed such that the opening of the lower interlayer insulation layer 27a is embedded. Then, the base layer 21 that is formed of a conductive material is formed on the via interconnect part 25 and the lower interlayer insulation layer 27a. The via interconnect part 25 includes, for example, a protrusion 25a in a central region 26L of the upper surface 26, and a recess 25b in a peripheral region 26E of the upper surface 26. In accordance with the protrusion 25a and the recess 25b on the upper surface 26 of the via interconnect part 25, for example, the base layer 21 includes a recess 21b of the base layer 21 in the central region 26L of the upper surface 26 of the via interconnect part 25, and a protrusion 21a of the base layer 21 in the peripheral region 26E of the upper surface 26 of the via interconnect part 25. A base layer that is formed of a conductive material such as Ta may be formed on the side surface of the opening of the lower interlayer insulation layer 27a before the via interconnect part 25 is formed.

Figure 10:
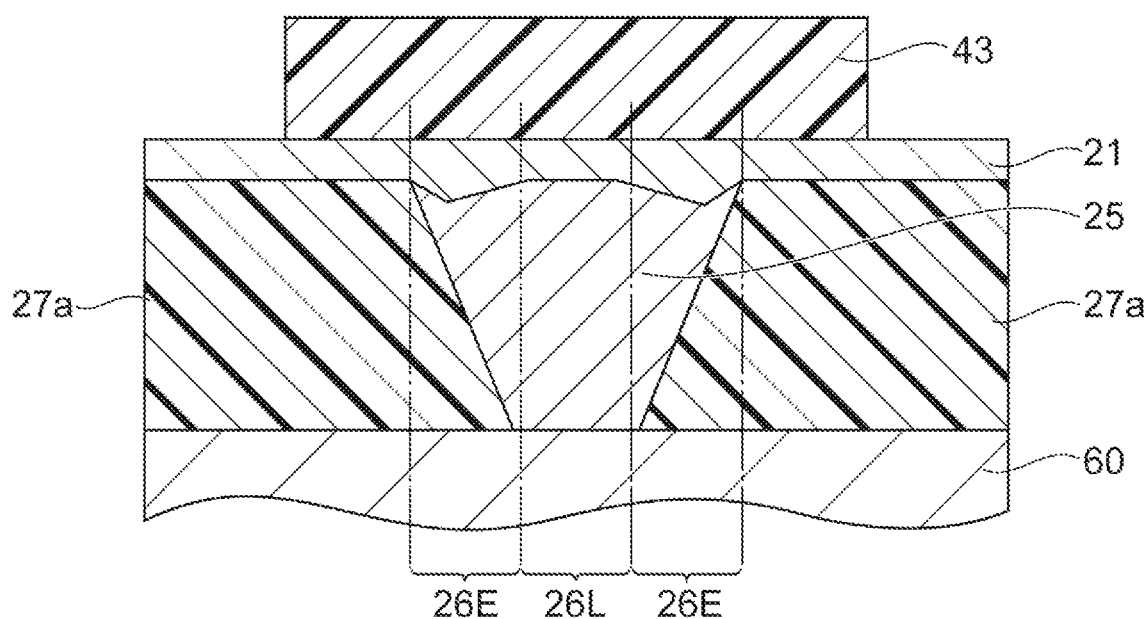
FIG. 10 is a view illustrating a cross-section for describing the specific example of the manufacturing method for the TMR element.
Figure 10:
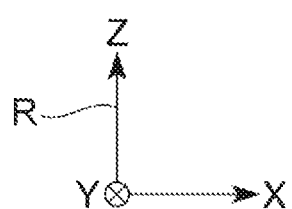

Next, as illustrated in FIG. 10, a resist 43 is formed on the base layer 21. The resist 43 is fixated at a position that is above the whole the via interconnect part 25 and a part of the lower interlayer insulation layer 27a in the perpendicular direction, and is not formed at a position that is above, in the perpendicular direction, a region in which an upper interlayer insulation layer 27b described later is fixated.

Figure 11:
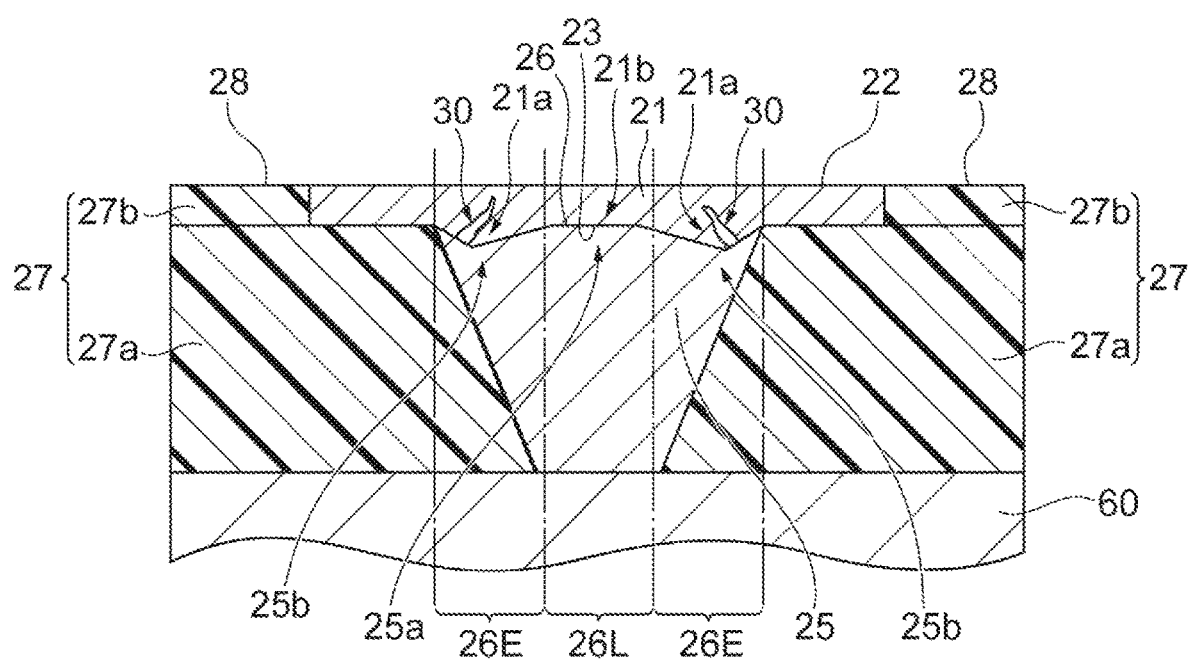
FIG. 11 is a view illustrating a cross-section for describing the specific example of the manufacturing method for the TMR element.
Figure 11:
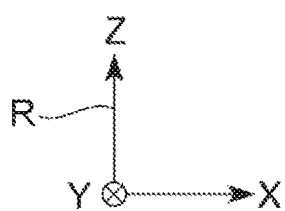

Next, as illustrated in FIG. 11, the base layer 21 is selectively etched by dry etching such as RIE using the resist 43 as a mask. The upper interlayer insulation layer 27b is formed in the etched region, and the resist 43 is removed. Then, the surface of each of the base layer 21 and the upper interlayer insulation layer 27b is flattened by polishing such as chemical mechanical polishing (CMP).

The upper surface of the base layer 21 is flattened by the polishing. Consequently, for example, when the via interconnect part 25 includes the protrusion 25a in the central region 26L of the upper surface 26 and the recess 25b in the peripheral region 26E of the upper surface 26, the base layer 21 has a thickness that is greater in the peripheral region 26E of the upper surface 26 of the via interconnect part 25 than in the central region 26L of the upper surface 26 of the via interconnect part 25. As a result of the polishing, the base layer 21 can include the stress relieving region 30 such as a crack in the peripheral region 26E of the upper surface 26 of the via interconnect part 25. Accordingly, the flatness of the surface 22 of the base layer 21 is higher than the flatness of the upper surface 26 of the via interconnect part 25.

The upper interlayer insulation layer 27b is fixated of the same material as the lower interlayer insulation layer 27a, but the surface 28 of the upper interlayer insulation layer 27b is polished by chemical mechanical polishing (CMP) or the like along with the surface 22 of the base layer 21. Thus, the upper interlayer insulation layer 27b can include a material of which the hardness is almost equal to the hardness of the base layer 21, such that the difference between the height of the lower surface 5b in the central region 26L and the height of the lower surface 5b in the peripheral region 26E is less than or equal to 2 nm in the tunnel barrier layer 5 formed on the base layer 21. The upper interlayer insulation layer 27b constitutes the interlayer insulation layer 27 along with the lower interlayer insulation layer 27a.

Figure 12:
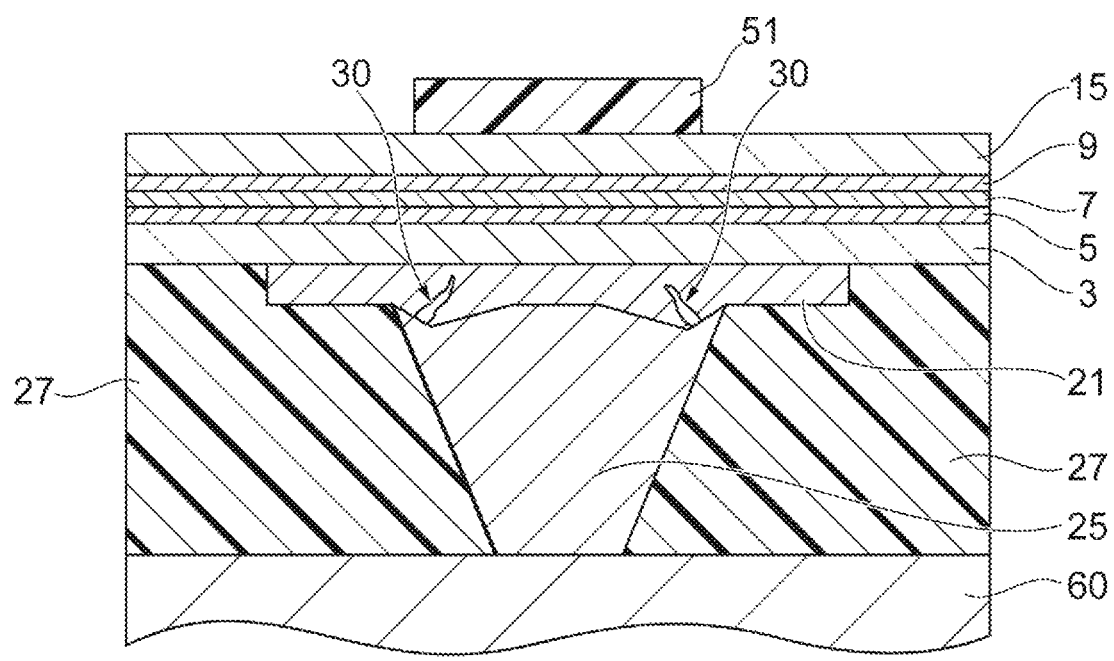
FIG. 12 is a view illustrating a cross-section for describing the specific example of the manufacturing method for the TMR element.

Next, as illustrated in FIG. 12, the reference layer 3, the tunnel barrier layer 5, the magnetization free layer 7, the perpendicular magnetization inducing layer 9, and the mask layer 15 are formed in this order on the whole surface on the base layer 21 and the interlayer insulation layer 27. Then, a resist 51 is fainted on a part of the surface of the mask layer 15. The resist 51 is formed at a position that is above the via interconnect part 25 in the perpendicular direction and above a part of the base layer 21 in the perpendicular direction. When necessary, a seed layer that is formed of a conductive material such as Ta and covers the whole surface on the base layer 21 and the interlayer insulation layer 27 may be formed between the base layer 21 and the interlayer insulation layer 27, and the reference layer 3.

Figure 13:
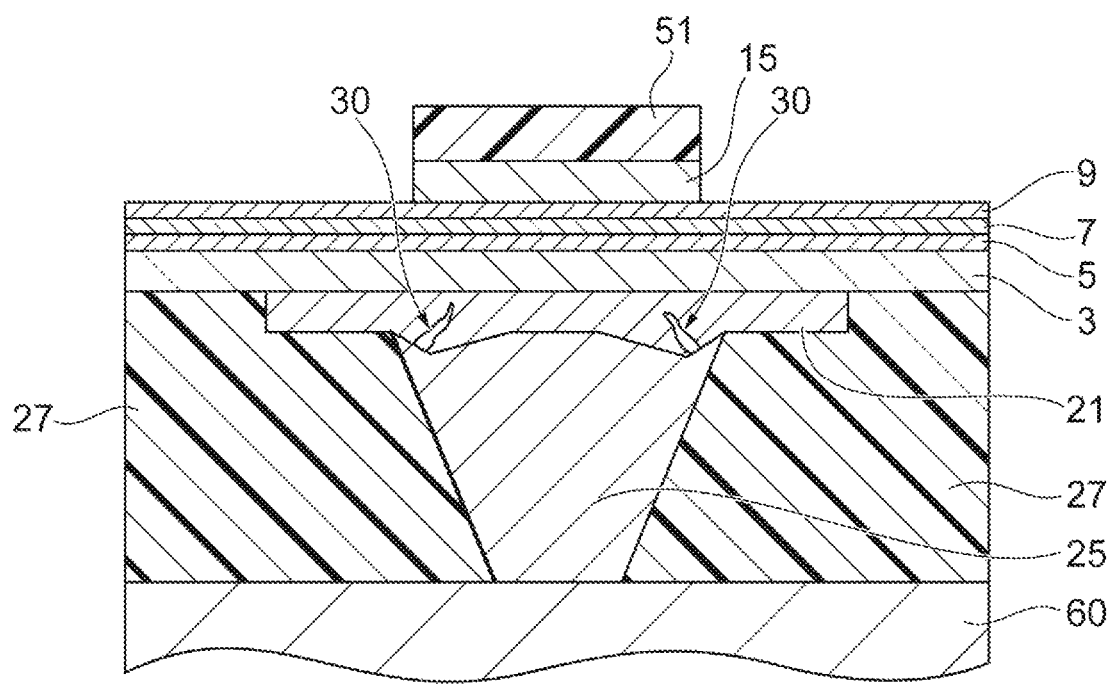
FIG. 13 is a view illustrating a cross-section for describing the specific example of the manufacturing method for the TMR element.
Figure 13:
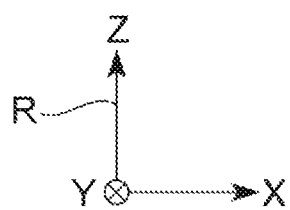

Next, as illustrated in FIG. 13, the mask layer 15 is selectively etched by dry etching such as RIE using the resist 51 as a mask, and the surface of the perpendicular magnetization inducing layer 9 is exposed.

Figure 14:
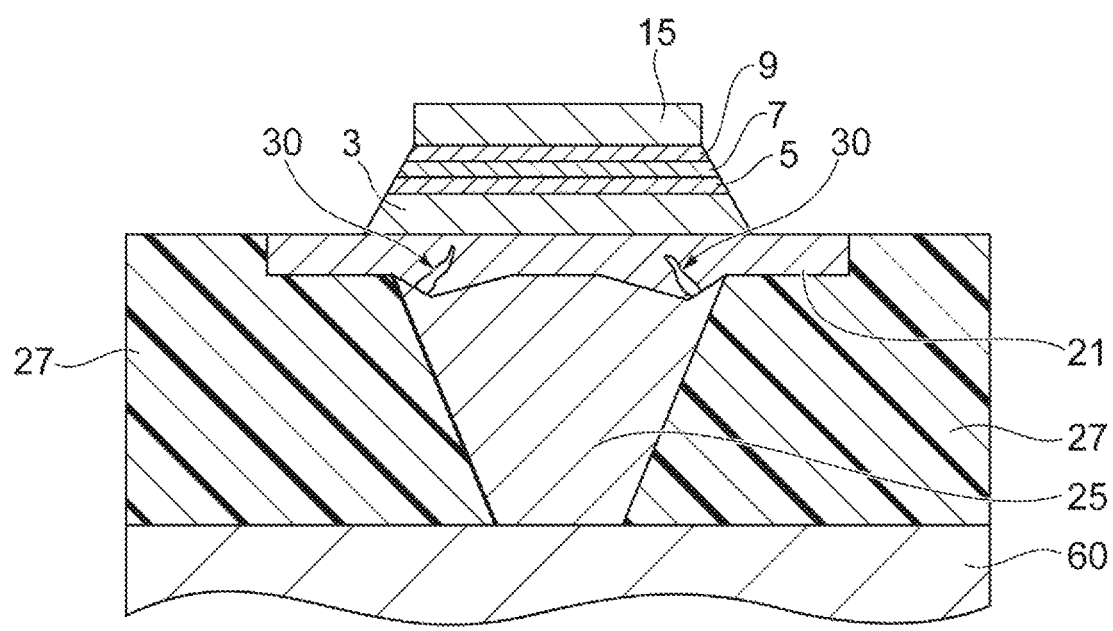
FIG. 14 is a view illustrating a cross-section for describing the specific example of the manufacturing method for the TMR element.
Figure 14:
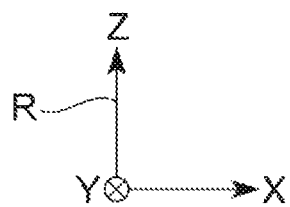

Next, as illustrated in FIG. 14, the resist 51 is removed. Then, the perpendicular magnetization inducing layer 9, the magnetization free layer 7, the tunnel barrier layer 5, and the reference layer 3 are etched by dry etching such as RIE using the mask layer 15 as a mask. The etching is stopped when the base layer 21 and the interlayer insulation layer 27 are exposed.

Figure 15:
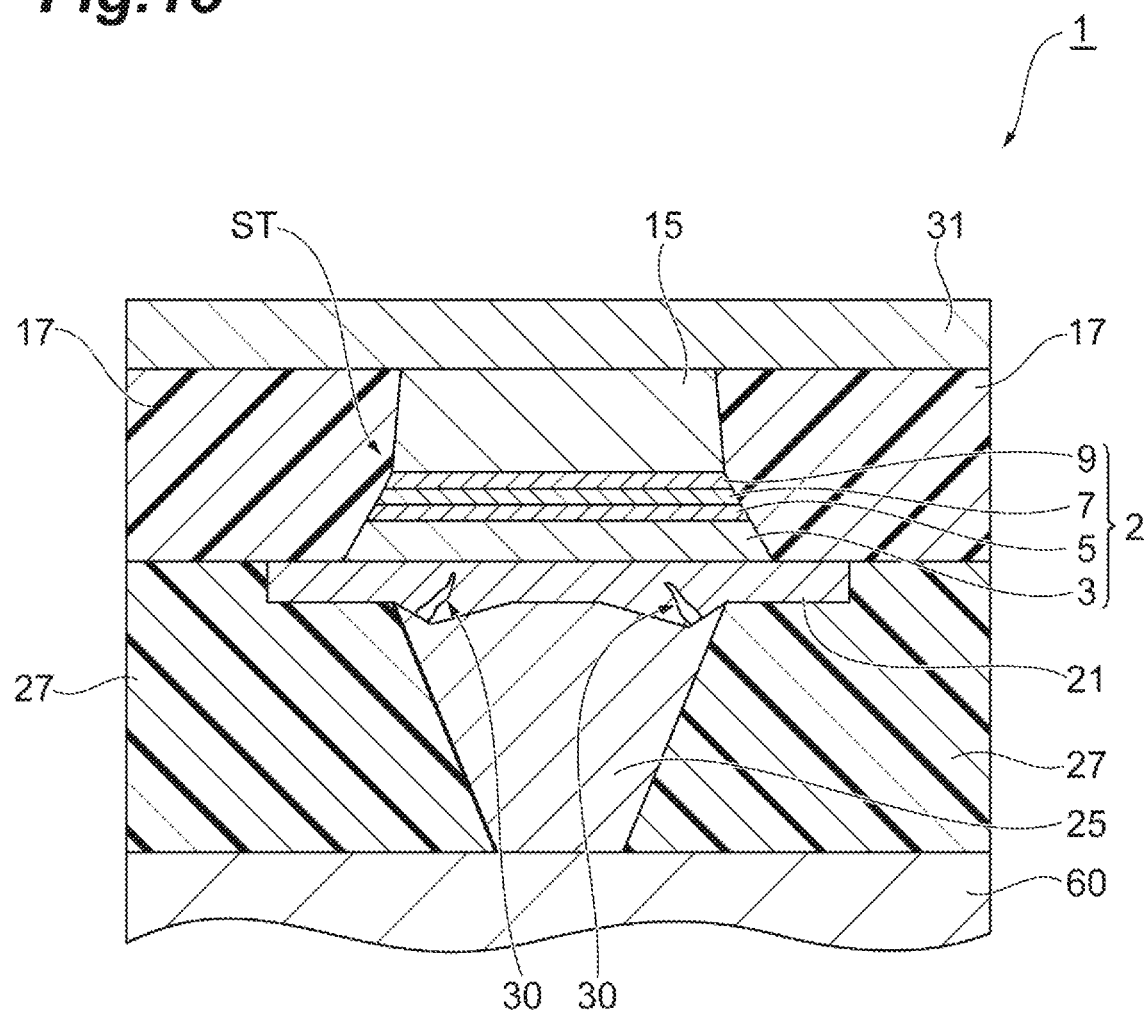
FIG. 15 is a view illustrating a cross-section for describing the specific example of the manufacturing method for the TMR element.

Next, as illustrated in FIG. 15, the TMR element 1 is completed by forming the side wall portion 17 on the base layer 21 and the interlayer insulation layer 27 such that the stack portion ST is embedded, and forming an upper electrode layer 31 on the mask layer 15 and the side wall portion 17.

Figure 16:
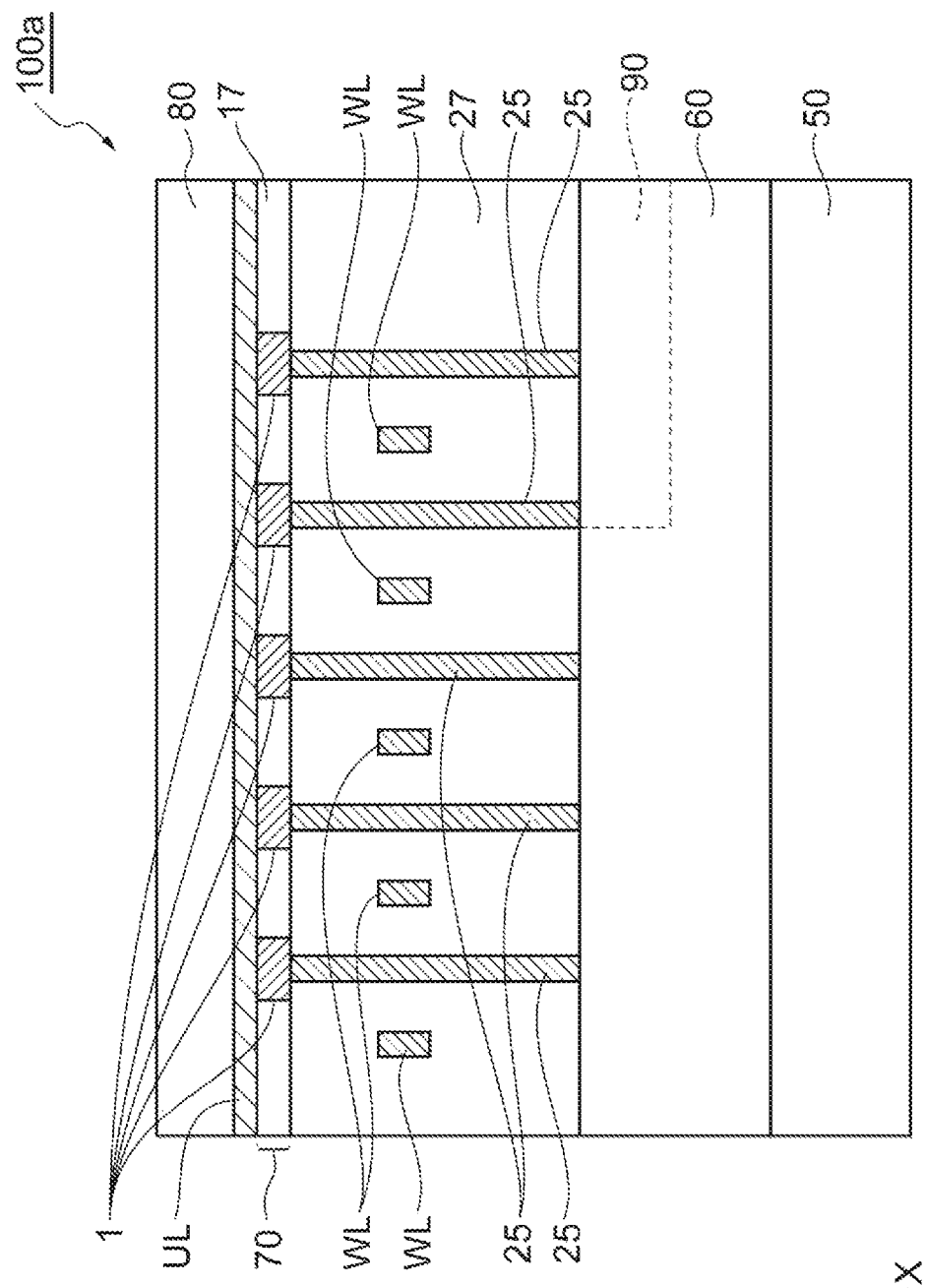
FIG. 16 is a schematic view of a vertical cross section of an MRAM according to a modification example of the embodiment.

FIG. 16 is a schematic view of a vertical cross section of an MRAM according to a modification example of the present embodiment. An MRAM 100a according to the present modification example is different from the MRAM 100 of the basic aspect of the present embodiment in that the MRAM 100a further includes a processor 90. In the MRAM 100a, an MRAM part is formed as a part of a step of forming the circuit of the processor 90. Thus, the processor 90 and the MRAM part of the MRAM 100a are integrated. Thus, the MRAM 100a is a built-in memory. Accordingly, the speed of data exchange between the processor 90 and the MRAM part is increased. In addition, since the MRAM part is installed above the processor 90, the density of the whole device can be increased.

REFERENCE SIGNS LIST

1 TMR ELEMENT
2 MAGNETIC L JUNCTION
3 REFERENCE LAYER
5 TUNNEL BARRIER LAYER
5b LOWER SURFACE
7 MAGNETIZATION FREE LAYER
21 BASE LAYER
22 SURFACE
23 INNER SURFACE
26 UPPER SURFACE
26E PERIPHERAL REGION
26L CENTRAL REGION
27 INTERLAYER INSULATION LAYER
30 STRESS RELIEVING REGION

The invention claimed is:

1. A tunnel magnetoresistive effect element comprising:
a base layer disposed on an upper surface of a via interconnect part;
a magnetic tunnel junction disposed on a surface of the base layer; and
an interlayer insulation layer covering side surfaces of the via interconnect part and the base layer,
wherein the base layer includes a stress relieving region,
the magnetic tunnel junction includes a reference layer having a magnetization fixed direction, a magnetization free layer, and a tunnel barrier layer disposed between the reference layer and the magnetization free layer,
the interlayer insulation layer includes an insulation material, and
the stress relieving region includes one or a plurality of cracks.

2. The tunnel magnetoresistive effect element according to claim 1,
wherein the base layer has a width that is greater than a width of the tunnel barrier layer.

3. The tunnel magnetoresistive effect element according to claim 1,
wherein a lower surface of the tunnel barrier layer has a difference of less than or equal to 2 nm between a height of the lower surface in a central region of the upper surface of the via interconnect part and the height of the lower surface in a peripheral region of the upper surface of the via interconnect part.

4. The tunnel magnetoresistive effect element according to claim 1,
wherein the stress relieving region extends toward the surface of the base layer from an inner surface of the base layer.

5. The tunnel magnetoresistive effect element according to claim 1,
wherein the base layer includes at least one nitride selected from a group consisting of Nb—N, Ta—N, Ti—N, V—N, and Zr—N.

6. The tunnel magnetoresistive effect element according to claim 1,
wherein the base layer includes at least one oxide selected from a group consisting of $NaRh_2O_4$, $NaV_2O_4$, $RuO_2$, $SrRuO_2$, $ReO_3$, and $IrO_2$.

7. The tunnel magnetoresistive effect element according to claim 1,
wherein the base layer includes at least one nitride selected from a group consisting of Nb—N, Ta—N, Ti—N, V—N, and Zr—N, and at least one oxide selected from a group consisting of $NaRh_2O_4$, $NaV_2O_4$, $RuO_2$, $SrRuO_2$, $ReO_3$, and $IrO_2$.

8. A magnetic memory comprising:
the tunnel magnetoresistive effect element according to claim 1, as a storage element.

9. A tunnel magnetoresistive effect element comprising:
a base layer disposed on an upper surface of a via interconnect part;
a magnetic tunnel junction disposed on a surface of the base layer; and
an interlayer insulation layer covering side surfaces of the via interconnect part and the base layer,
wherein the base layer includes a stress relieving region,
the magnetic tunnel junction includes a reference layer having a magnetization fixed direction, a magnetization free layer, and a tunnel barrier layer disposed between the reference layer and the magnetization free layer,
the interlayer insulation layer includes an insulation material, and
the base layer has a thickness that is greater in a peripheral region of the upper surface of the via interconnect part than in a central region of the upper surface of the via interconnect part, and
the base layer includes the stress relieving region in the peripheral region of the upper surface of the via interconnect part.

10. The tunnel magnetoresistive effect element according to claim 9,
wherein when a width of the base layer is denoted by WU, and the thickness of the base layer in the peripheral region of the upper surface of the via interconnect part is denoted by TE, the base layer has the width WU that satisfies Expression (1)

$$WU > 16.4 \times TE \tag{1}.$$

11. A tunnel magnetoresistive effect element comprising:
a base layer disposed on an upper surface of a via interconnect part;
a magnetic tunnel junction disposed on a surface of the base layer; and
an interlayer insulation layer covering side surfaces of the via interconnect part and the base layer,
wherein the base layer includes a stress relieving region,
the magnetic tunnel junction includes a reference layer having a magnetization fixed direction, a magnetization free layer, and a tunnel barrier layer disposed between the reference layer and the magnetization free layer,
the interlayer insulation layer includes an insulation material, and
the base layer has a width that is greater than a width of the tunnel barrier layer.

* * * * *